(12) United States Patent
Mao et al.

(10) Patent No.: US 9,222,837 B2
(45) Date of Patent: Dec. 29, 2015

(54) BLACK SILICON-BASED HIGH-PERFORMANCE MEMS THERMOPILE IR DETECTOR AND FABRICATION METHOD

(71) Applicant: JIANGSU R&D CENTER FOR INTERNET OF THINGS, Wuxi (CN)

(72) Inventors: Haiyang Mao, Wuxi (CN); Wen Ou, Wuxi (CN)

(73) Assignee: JIANGSU R&D CENTER FOR INTERNET OF THINGS, Wuxi (CN)

( * ) Notice: Subject to any disclaimer, the term of this patent is extended or adjusted under 35 U.S.C. 154(b) by 0 days.

(21) Appl. No.: 14/412,408

(22) PCT Filed: Jan. 21, 2013

(86) PCT No.: PCT/CN2013/000065
§ 371 (c)(1),
(2) Date: Dec. 31, 2014

(87) PCT Pub. No.: WO2014/029190
PCT Pub. Date: Feb. 27, 2014

(65) Prior Publication Data
US 2015/0168221 A1    Jun. 18, 2015

(30) Foreign Application Priority Data
Aug. 23, 2012 (CN) .......................... 2012 1 0303746

(51) Int. Cl.
*H01L 31/058* (2006.01)
*G01J 5/12* (2006.01)
(Continued)

(52) U.S. Cl.
CPC ... *G01J 5/12* (2013.01); *B81B 7/02* (2013.01); *B81C 1/00111* (2013.01); *G01J 5/022* (2013.01);
(Continued)

(58) Field of Classification Search
CPC ...... B81B 2201/0278; B81B 7/02; G01J 5/12
USPC ............................................... 257/467
See application file for complete search history.

(56) References Cited

U.S. PATENT DOCUMENTS

2003/0148620 A1*  8/2003  Chavan et al. ................. 438/706
2015/0137304 A1*  5/2015  Mao et al. ..................... 257/467

*Primary Examiner* — Daniel Whalen
(74) *Attorney, Agent, or Firm* — Anova Law Group, PLLC (57) ABSTRACT

This invention involves structure and fabrication method of a black silicon-based MEMS thermopile IR detector. The high-performance black silicon-based MEMS thermopile IR detector includes a substrate; a releasing barrier band on the substrate; a thermal isolation cavity constructed by the releasing barrier band; a black silicon-based IR absorber located right above the thermal isolation cavity; a number of thermocouples are set around the lateral sides of the black silicon-based IR absorber. The thermopiles around the black silicon-based IR absorber are electrically connected in series thus to form a thermopile. Metallic electrodes are located beside the electrically-connected thermopiles for signal output. The cold junctions of the thermopile are connected to the substrate through the first thermal-conductive-electrical-isolated structures, the heat conductor is located at the lateral sides of the thermal isolation cavity. The hot junctions of the thermopile are in contact with the IR absorber through the second thermal-conductive-electrical-isolated structures, and the second thermal-conductive-electrical-isolated structures are located above the releasing barrier band. The structure of such detector is simple, and it is easy to implement and can also be monolithically integrated. Such detector has high responsivity and detection rate, and is CMOS-compatible, thus can be used widely in a safe and reliable manner.

6 Claims, 6 Drawing Sheets

(51) Int. Cl.
*G01J 5/02* (2006.01)
*B81B 7/02* (2006.01)
*B81C 1/00* (2006.01)
*H01L 35/22* (2006.01)
*H01L 35/32* (2006.01)
*H01L 35/34* (2006.01)

(52) U.S. Cl.
CPC ............... *H01L 35/22* (2013.01); *H01L 35/32* (2013.01); *H01L 35/34* (2013.01); *B81B 2201/0278* (2013.01)

BLACK SILICON-BASED HIGH-PERFORMANCE MEMS THERMOPILE IR DETECTOR AND FABRICATION METHOD

FIELD OF THE INVENTION

This invention involves an infrared (IR) detector and fabrication method and, especially, a black silicon-based high-performance MEMS thermopile IR detector and its fabrication method. The invention belongs to a technical field of MEMS IR detectors.

BACKGROUND

MEMS thermopile IR detector is a typical device in the field of sensing detection and one of the core components for constituting temperature sensor, root-mean-square converter, gas sensor, thermal flow meter and other sensor detectors. Moreover, small size thermopile IR detector can also be used for constructing IR focal plane arrays (FPA) and thus realizing IR imaging. Compared with IR detectors based on other operating principles (such as pyroelectric IR detectors and thermistor IR detectors etc.), thermopile IR detector has obvious comprehensive benefits of measurable constant radiant quantity, having no need to apply bias voltage or use chopper, and being more applicable to mobile applications and field applications. Thus, MEMS thermopile IR detector has an important significance for achieving broader IR detection applications. It has broad civilian and military prospects, and it also has enormous business value and market potential. Research and development of the MEMS thermopile IR detector has become a newly high-tech industry growth point for the 21$^{st}$ century. It can be predicted that MEMS thermopile IR detector will become a more widely used device in many aspects of sensing detection. In particular, as MEMS technology, including device design, manufacturing, packaging, testing and other techniques are becoming increasingly sophisticated, MEMS thermopile IR detector will have a more important position in this field.

Responsivity and detection rate are two important performance parameters for describing IR detector and determining its potential applications in different fields, of which responsivity is the ratio of electrical output and incident IR radiation power, indicating the sensitivity of the IR detector responding to IR radiation. Responsivity affects the value of the detection rate greatly. For a thermopile IR detector, the temperature difference between the hot junctions and cold junctions of the thermocouple strips is an important parameter reflecting the responsivity and detection rate of the device. In order to increase the temperature difference and thereby improve performance of the device, the temperature of the cold junctions is usually maintained to be consistent with that of the substrate. Meanwhile, the hot junctions should be able to effectively transfer the heat absorbed by the IR absorber to the thermocouples. To achieve this effect, realization of heat-conducting structures between cold junctions and substrate as well as between hot junctions and IR absorber is necessary, considering the electrical series connection among thermocouples. The heat-conducting structures shall also have the function of electrical isolation. The reported thermopile IR detectors mainly use their substrates as heat sinks, where the cold junctions of the thermocouples usually overlap directly with the substrates while the hot junctions overlap directly with the absorbers. As the materials of the substrates and the absorbers are conductive to some extent, such a direct overlapping method may influence the output signals of the thermopile IR detectors and ultimately affect device performance.

For thermopile IR detector with fixed structural types (including thermal-conductive-electrical-isolated structures), dimensions, thermocouple materials and other parameters, the values of its responsivity and detection rate shall depend on the absorption efficiency of their IR absorber. In research of IR detectors, silicon nitride films are often used as IR absorbers. However, in the wavelength range of 1-12 μm, the average IR absorption efficiency that can be obtained from silicon nitride is only about 35%. Besides, the thermopile IR detector with silicon nitride-based IR absorber cannot get a high responsivity and detection rate. In view of this, to improve the responsivity and detection rate of IR detectors, it is necessary to increase the absorption efficiency of the IR absorber. In study of the IR detectors over the past few decades, researchers have developed a variety of materials or structures with high absorption and can be used as IR absorbers, among which, gold-black has excellent IR absorption effect due to its nanoscale rough surfaces and is an extremely popular material in research of IR detectors because of its low thermal capacity. When using the material of gold-black as IR absorber, the responsivity and detection rate of the devices can be increased accordingly. However, the preparation of gold-black involves metal evaporation, metallic nano-particle agglutination and other complicated processes. Moreover, its compatibility with the CMOS process is poor and generally can only be produced on structure surfaces after completing process of device structures. In view of this, the mass production of detectors with gold-black as the absorber is limited. ¼-wavelength resonant structures make use of the resonance effect generated when the thickness of the dielectric layer matches the ¼-wavelength of incident IR light to maximize the absorption efficiency of the IR absorber. However, constrained by the resonance condition, detectors using ¼-wavelength resonant structures as absorbers are only sensitive to IR radiation of certain central wavelengths. In addition, the processing requirements for preparation of ¼-wavelength resonant structures are extremely strict. If the dielectric layer thickness and wavelength are slightly unmatched, the IR absorption efficiency will be subject to great attenuation.

Black silicon has a kind of large area forest-like nano-pillar/needle structure. It was once deemed to be a revolutionary new material in electronics industry. Compared with the material of conventional silicon, black silicon has very high absorption efficiency for near-IR light. At present, a variety of methods for preparing black silicon have been proposed, such as high energy femtosecond laser-assisted etching, metal catalysis electrochemical etching and plasma dry etching. Based on comprehensive consideration of processing costs, convenient level of technology, processing compatibility and other aspects, the method of plasma dry etching for preparing black silicon is most commonly used in conventional microfabrication. Researchers have reported the usage of black silicon as the material of IR absorber to improve the performance of thermopile IR detectors: after formation of the basic structure of a thermopile IR detector (including a supporting membrane, thermopile, metallic connection structures and so on), α-Si or Poly-Si layer is deposited on the surface by plasma enhanced chemical vapor deposition (PECVD) technology, high energy ion implantation is carried out, followed by incomplete dry etching. In this way, black silicon can be obtained from the silicon layer and can also be patterned in the IR absorber region. Finally, the device is released. In this method, incomplete etching is adopted for fabricating black silicon. Thus, the controllability over the shapes and sizes of the black silicon is low. For this method, in addition, before the preparation of black silicon, high energy ion implantation is needed for introducing defects in the silicon layer. This thereby increases the complexity of the process. Moreover, this method adopts the technical idea of "black silicon first, followed by structure release". Thus, it requires strict protection of black silicon from damage during the process of structure release. However, black silicon maintains physical and chemical properties of silicon material to some extent, and is vulnerable to etchant gas destruction during the subsequent $XeF_2$ dry release process; moreover, as the nanostructures in black silicon are with certain height and density, conventional methods such as membrane deposition or coating protection cannot achieve effective protection.

BRIEF SUMMARY OF THE DISCLOSURE

The purpose of this invention is to overcome the shortcomings of existing technologies and provide a black silicon-based high-performance MEMS thermopile IR detector and its fabrication method. The structure of such detector is simple, and it is easy to implement and can also be monolithically integrated. Such detector has high responsivity and detection rate, and is CMOS-process compatible, thus can be used widely in a safe and reliable manner.

According to the technical solutions provided by this invention, the described high-performance MEMS thermopile IR detector based on black silicon comprises a substrate; a releasing barrier band on the substrate; a thermal isolation cavity constructed by the releasing barrier band. The IR absorber is set right above the thermal isolation cavity and the IR absorber is set on the releasing barrier band; the outer ring of the IR absorber is set with a number of thermopiles. A number of thermopiles are set around the lateral sides of the black silicon-based IR absorber. The thermopiles around the black silicon-based IR absorber are electrically connected in series, and are equipped with metal electrodes for voltage output. One-side terminals of the thermopile adjacent to the IR absorber form the hot junctions and the other-side terminals far away from the IR absorber form the cold junctions. The cold junctions of the thermopile are connected to the substrate through the first thermal-conductive-electrical-isolated structures as well as the heat conductor under the first thermal-conductive-electrical-isolated structures. The heat conductor is located outside the thermal isolation chamber but between the releasing barrier band and the substrate. The first thermal-conductive-electrical-isolated structures are embedded in the releasing barrier band; the hot junctions of the thermopile are in contact with the IR absorber through the second thermal-conductive-electrical-isolated structures, and the second thermal-conductive-electrical-isolated structures are located above the releasing barrier band.

The black silicon-based IR absorber is in a square shape, and four groups of thermocouples are uniformly distributed at four lateral sides of the IR absorber, thus to form a thermopile.

The black silicon-based IR absorber comprises black silicon structures formed from black silicon material through reactive ion etching (RIE) and releasing channels that run through the black silicon-based IR absorber. The releasing channels and the thermal isolation chamber are connected with each other.

The thermopile comprises P-type thermocouple strips and N-type thermocouple strips that correspond to the P-type thermocouple strips. The N-type thermocouple strips and P-type thermocouple strips are located above the releasing barrier band. At cold junctions of the thermopile, both the P-type thermocouple strips and N-type thermocouple strips are in contact with the first thermal-conductive electrical isolation structures, and the P-type thermocouple strips are electrically connected with N-type thermocouple strips in adjacent thermocouples through the second connecting lines. At hot junctions of the thermopile, both the P-type thermocouple strips and N-type thermocouple strips are in contact with the second thermal-conductive electrical isolation structures and electrically connected with each other through the first connecting lines.

The black silicon material is prepared on the releasing barrier band by means of LPCVD or PECVD technology.

Material for both the first thermal-conductive-electrical-isolated structures and the second thermal-conductive-electrical-isolated structures includes $Si_3N_4$.

For the fabrication of a black silicon-based high-performance MEMS thermopile IR detector, the fabrication method includes the following steps:

a. Providing a substrate and setting a substrate protective layer on the surface of the substrate.

b. Etching the substrate protective layer selectively, so as to form substrate contacting windows above the substrate. The substrate contacting windows run through the substrate protective layer.

c. Depositing a layer of heat conductor over the substrate contacting windows, and depositing a mask layer on the heat conductor. The heat conductor covers the substrate protective layer and fills in the substrate contacting windows.

d. Etching the heat-conductor mask layer selectively so as to form heat-conductor etching windows. The heat-conductor etching windows run through the heat-conductor mask layer along the inner sides of the substrate contacting windows. Using the heat-conductor etching windows to etch the heat conductors till reaching the substrate protective layer thus to form heat-conductor through-holes.

e. Depositing a supporting layer on the heat-conductor mask layer, making the supporting layer fill in the heat-conductor through-holes and heat-conductor etching windows, and also cover the heat-conductor mask layer so as to form a releasing barrier band and the supporting membrane over the substrate.

f. Etching the supporting layer selectively so as to form thermal-conductive-electrical-isolated openings within the supporting layer. The thermal-conductive-electrical-isolated openings run through the supporting layer and locate at the lateral sides of the releasing barrier band. Depositing a thermal-conductive-electrical-isolated layer over the supporting layer. The thermal-conductive-electrical-isolated layer fills in the thermal-conductive-electrical-isolated openings, and covers the supporting layer.

g. Etching the thermal-conductive-electrical-isolated layer selectively, so as to form the first thermal-conductive-electrical-isolated blocks and the second thermal-conductive-electrical-isolated blocks over the supporting layer. The first thermal-conductive-electrical-isolated blocks are within the supporting layer and the second thermal-conductive-electrical-isolated blocks are over the supporting layer.

h. Setting thermocouple strips within the region between the first thermal-conductive-electrical-isolated blocks and the second thermal-conductive-electrical-isolated blocks close to the first ones. The thermocouple strips include N-type thermocouple strips and P-type thermocouple strips. The cold junctions of thermocouple strips are in contact with the first thermal-conductive-electrical-isolated blocks and the hot junctions are in contact with the second thermal-conductive-electrical-isolated blocks.

i. A thermocouple protective layer is set over the thermocouple strips, the region covered by the thermocouple protective layer comprises of the thermocouple strips and the first thermal-conductive-electrical-isolated blocks; the black silicon material is formed within the region constructed by the second thermal-conductive-electrical-isolated blocks; and the black silicon material is in contact with the second thermal-conductive-electrical-isolated blocks.

j. Etching the thermocouple protective layer selectively, so as to form electrical-connection through-holes above the substrate for purpose of connecting thermocouple strips.

k. Sputtering a metal layer on the substrate with produced electrical-connection through-holes. The metal layer shall be filled in the electrical-connection through-holes. Masking and etching the metal layer selectively and make the N-type thermocouple strips and P-type thermocouple strips be electrically connected at the hot junctions through the first connecting lines. At the hot junctions, electrically connecting the P-type thermocouple strips to the N-type thermocouple strips in adjacent thermocouples through the second connecting lines; forming the first electrical connectors at the lateral sides of the first thermal-conductive-electrical-isolated structures.

l. Depositing a passivation layer on the substrate. The passivation layer covers the black silicon material, the first connecting lines, the second connecting lines and the first electrical connectors.

m. Etching the passivation layer selectively, so as to form black silicon etching windows on the passivation layer over the black silicon material; etching the black silicon material with help of the black silicon etching windows, till reaching the heat conductor right under the black silicon etching windows to form releasing openings.

n. Releasing the heat conductor right under the black silicon material using the releasing barrier band as an etching stop, thus to obtain a thermal isolation cavity.

o. Using the passivation layer as the sidewall material for the black silicon material with rough surface; applying RIE on the black silicon material so as to form black silicon-based IR absorber, and at the same time to form the second electrical connectors.

In the above-mentioned steps of m and n, coating the inner walls of the releasing openings with a releasing barrier layer for protecting the black silicon material.

In the step h, the P-type thermocouple strips and N-type thermocouple strips are located above the releasing barrier band. At cold junctions of the thermopile, both P-type thermocouple strips and N-type thermocouple strips are in contact with the first thermal-conductive-electrical-isolated blocks, while at the hot junctions, both P-type thermocouple strips and N-type thermocouple strips are in contact with the second thermal-conductive-electrical-isolated blocks.

In the step k, the material of the metal layer includes Al.

The advantages of the invention include:

1. Black silicon-based IR absorber is used: due to the high absorption efficiency of the black silicon, high responsivity, high detection rate and other outstanding features of the device can be achieved, in this way, black silicon may overcome the poor responsivity and detection rate of detectors using $Si_3N_4$ as the material of the IR absorber.

2. There are no stringent requirements on the process parameters (such as thickness of $SiO_2$ and Poly-Si, etching time and etching thickness etc.) for preparing the black silicon. Therefore, the black silicon-based IR detector is easy to realize, and thus can overcome the defects of the detectors using ¼-wavelength resonant structures as absorbers, including the stringent requirements on process parameters and poor controllability of performance.

3. As black silicon may achieve very high IR absorption efficiency within a large wavelength range, such devices have a large applicable wavelength range and may overcome the defects of the detectors using ¼-wavelength resonant structure-based absorbers as being only applicable to certain central wavelengths.

4. The technical idea of "release first, followed by black silicon preparation" is used in the fabrication process of this invention, which effectively overcomes the problem of easily damaged black silicon structures with the method of "black silicon first, followed by structure release".

5. Design and fabrication of thermal-conductive-electrical-isolated structures are carried out respectively at the hot/cold junctions of the invented detector, which may further improve the performance of the device.

6. Fabrication process of the detector is fully compatible with CMOS process, which is conducive to monolithic integration of the detector structure with circuit.

7. The novel MEMS thermopile IR detector with high performance presented in this invention has features of excellent processing compatibility with CMOS fabrication, easy realization of device structure, easy monolithic integration with circuit, high responsivity and detection rate, and also can be widely and practically used in temperature sensors, gas sensors, thermal flow meters and other sensing devices and systems.

BRIEF DESCRIPTION OF THE DRAWINGS

FIGS. 1 to 15 show the section views of specific processing steps of this invention and more specifically:

ILLUSTRATION OF MARKS IN FIGURES

1—Black silicon-based IR absorber, 2—Releasing barrier band, 3—the second thermal-conductive-electrical-isolated structures, 4—the first thermal-conductive-electrical-isolated structures, 5—P-type thermocouple strips, 6—N-type thermocouple strips, 7—metal connecting lines, 8—Electrodes, 9—Releasing channels, 101—Substrate, 102—substrate protective layer, 202—Substrate contacting windows, 302—Heat-conductor fill-in structures, 303—Heat conductor, 304—Heat-conductor mask layer, 403—Heat-conductor through-holes, 404—Heat-conductor etching windows, 503—Releasing barrier band structure, 504—Supporting membrane, 505—Supporting layer, 605—thermal-conductive-electrical-isolated openings, 606—Thermal-conductive-electrical-isolated layer, 705—the first thermal-conductive-electrical-isolated blocks, 706—the second thermal-conductive-electrical-isolated blocks, 807—cold junctions, 810—hot junctions, 811—thermocouple strips, 908—thermocouple protective layer, 909—black silicon material, 910—bridging region, 1008—Electrical-connection through-holes, 1109—the first connecting lines, 1110—the first electrical connectors, 1111—the second connecting lines, 1211—Passivation layer, 1309—Releasing openings, 1311—Black silicon etching windows, 1312—releasing barrier layer, 1403—thermal isolation cavity, 1412—black silicon releasing barrier layer, 1509—black silicon structure and 1510—the second electrical connectors.

DETAILED DESCRIPTION

The invention will be further described with accompanying specific drawings and embodiments.

Figure 17:
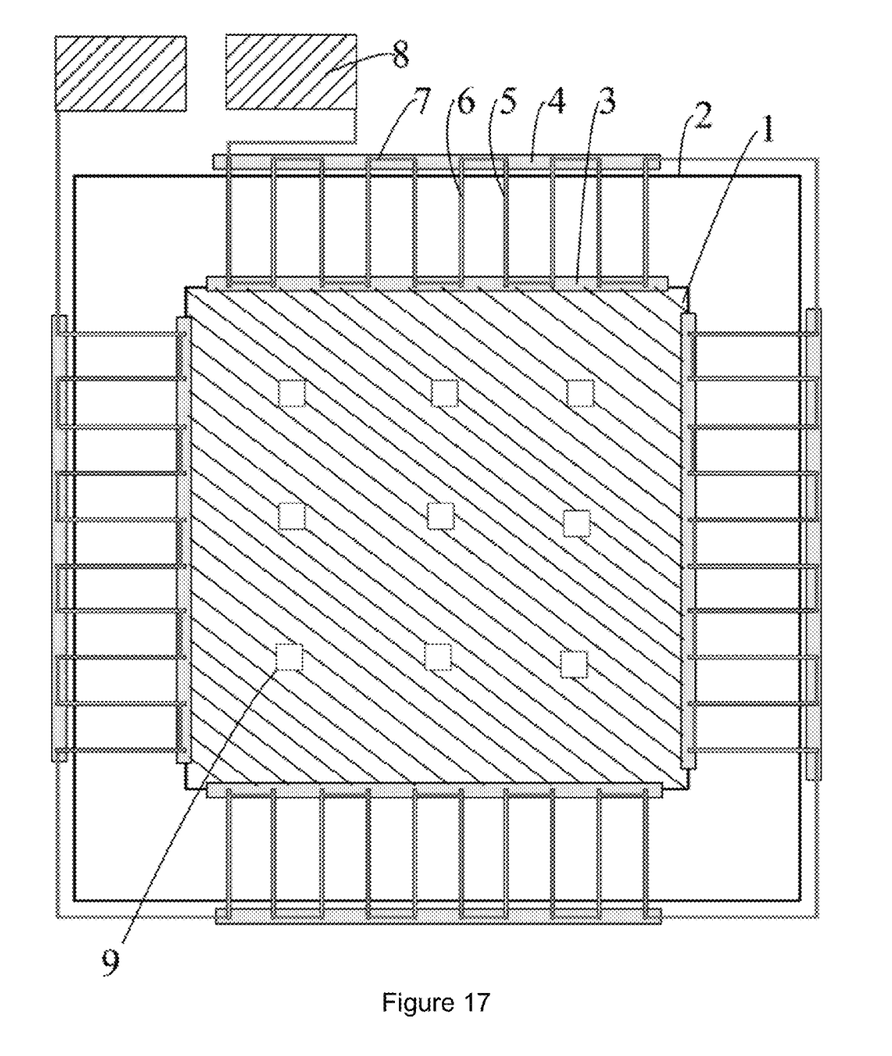
FIG. 17 shows the structure diagram of this invention.

As shown in FIG. 17: the black silicon-based high-performance MEMS thermopile IR detector as described in this invention comprises a substrate 101; a releasing barrier band 2 on the substrate 101; the thermal isolation cavity 1403 constructed by and within the releasing barrier band 2; a black silicon-based IR absorber 1 right above the thermal isolation cavity 1403 and the black silicon-based IR absorber 1 is set above the releasing barrier band 2; a number of thermocouple strips are set around the lateral sides of the IR absorber 1.

The thermocouple strips around the black silicon-based IR absorber 1 are electrically connected in series. The thermopile being connected in series are equipped with electrodes 8, which are used to output signals. The terminals of the thermopile adjacent to the IR absorber form the hot junctions, while the terminals far away from the IR absorber form the cold junctions. The cold junctions of the thermopile are connected to the substrate 101 through the first thermal-conductive-electrical-isolated structures 4 as well as the heat conductor 303 under the first thermal-conductive-electrical-isolated structures 4, where the heat conductor 303 are located outside the thermal isolation cavity 1403 but between the releasing barrier band 2 and the substrate 101. The first thermal-conductive-electrical-isolated structures 4 are embedded in the releasing barrier band 2; and the hot junctions of thermopile are in contact with the IR absorber through the second thermal-conductive-electrical-isolated structures 3, and the second thermal-conductive-electrical-isolated structures 3 are located on the releasing barrier band 2.

Material for both the first thermal-conductive-electrical-isolated structures 4 and the second thermal-conductive-electrical-isolated structures 3 includes $Si_3N_4$. Thermal conduction and electrical isolation can be achieved by using the first thermal-conductive-electrical-isolated structures 4 and the second thermal-conductive-electrical-isolated structures 3, so as to make the cold junctions of the thermopile have the same temperature as that of the substrate 101. The hot junctions of the thermopile receives heat absorbed by the IR absorber through the second thermal-conductive-electrical-isolated structures 3, so as to improve the responsivity and sensitivity of the IR detector.

In one embodiment, the shape of the black silicon-based IR absorber 1 is a square, four groups of thermopiles are uniformly distributed at lateral sides of the IR absorber. Thermopiles are symmetrically set around the four lateral sides of the IR absorber. The IR absorber can be of any shapes as needed, such as rectangular, circular, square shape, complex shapes etc., and the thermopiles are distributed in accordance with the shape of the IR absorber. The four groups of thermopiles are electrically connected by means of connecting lines 7, forming electrical resistance. After the thermopiles are electrically connected in series, two electrodes 8 are used to output voltage signals of heat detected by thermopile. The IR heat absorbed by the IR absorber can be reflected based on changes in voltage signals.

In one embodiment, the black silicon-based IR absorber 1 is composed of black silicon structures 1509 and releasing channels 9 that run through the IR absorber. The black silicon structures 1509 are produced from black silicon material 909 by making use of the feature that the rough surfaces of Poly-Si can be utilized as sidewall supporters in highly selective anisotropic etching process. The releasing channels 9 and thermal isolation cavity 1403 are interconnected.

Figure 15:
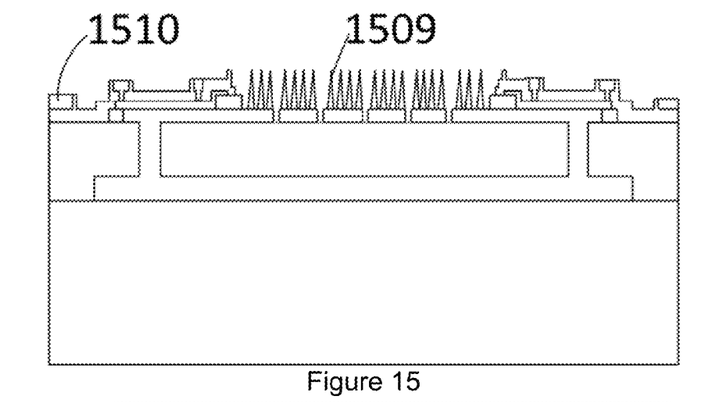
FIG. 15 shows the section view after the black silicon-based IR absorber is formed.

As shown in FIG. 15: in one embodiment, the thermopile comprises a number of P-type thermocouple strips 5 and N-type thermocouple strips 6 that correspond to the P-type thermocouple strips 5. A thermocouple is formed between one P-type thermocouple strip 5 and one corresponding N-type thermocouple strip 6. The P-type thermocouple strips 5 and N-type thermocouple strips 6 are located over the releasing barrier band 2. At the cold junctions of the thermopile, both P-type thermocouple strips 5 and N-type thermocouple strips 6 are in contact with the first thermal-conductive-electrical-isolated structures 4 and the P-type thermocouple strips 5 are electrically connected with N-type thermocouple strips 6 in adjacent thermocouples through the second connecting lines 1111, while at the hot junctions of thermopile, both P-type thermocouple strips 5 and N-type thermocouples strips 6 are in contact with the second thermal-conductive-electrical-isolated structures 3 and are electrically connected through the first connecting lines 1109. The releasing barrier band 2 in FIG. 17 corresponds to the releasing barrier band structure 503 in FIG. 5, the first thermal-conductive-electrical-isolated structures 4 are in corresponding to the first thermal-conductive-electrical-isolated blocks 705 in FIG. 7, and the second thermal-conductive-electrical-isolated structures 3 are in corresponding to the second thermal-conductive-electrical-isolated blocks 706.

Figure 1:
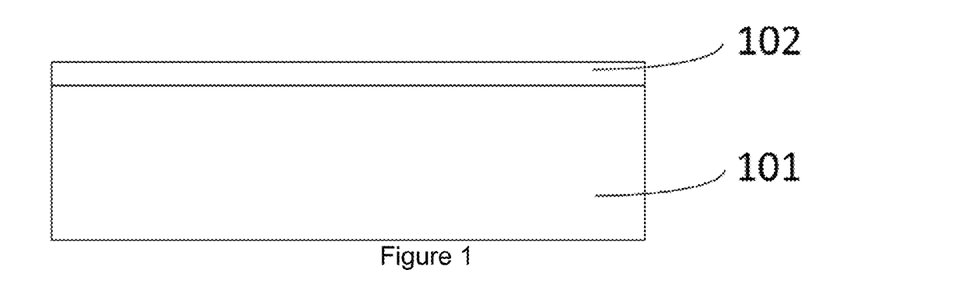
FIG. 1 shows the section view of this invention after the substrate protective layer is formed on the substrate.

As shown in FIG. 1 to FIG. 15: the described structure of the thermopile IR detector can be achieved using the following process steps. In certain embodiments, if there is no special requirement, the process steps may include any proper methods, the reagents and materials can be obtained commercially. More specifically, the process steps include:

a. Providing a substrate 101 and setting a substrate protective layer 102 on the surface of the substrate 101.

Figure 2:
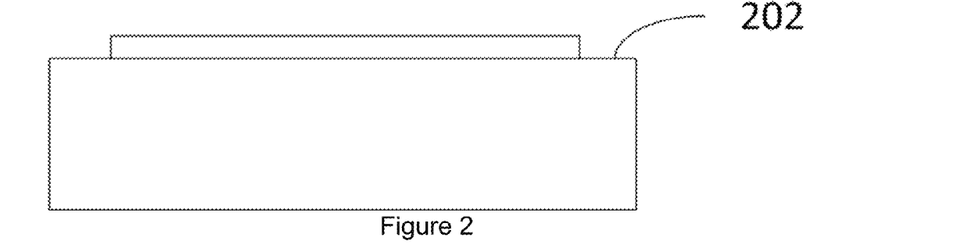
FIG. 2 shows the section view of this invention after the substrate contacting windows are formed.
Figure 3:
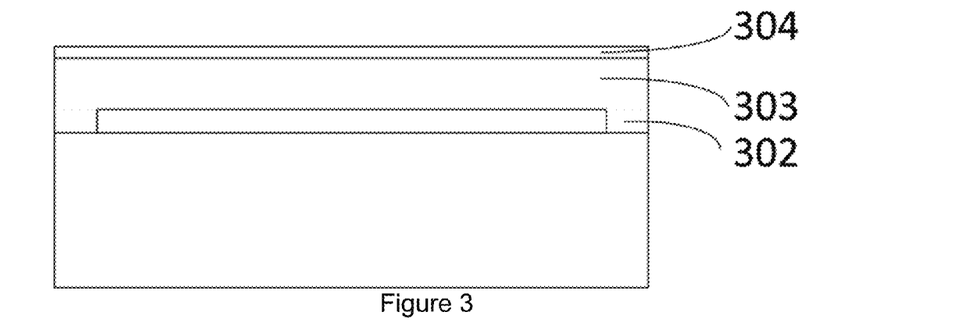
FIG. 3 shows the section view of this invention after the heat-conductor mask layer is formed.

As shown in FIG. 1, growing a $SiO_2$ layer on surface of the substrate 101 by means of dry-oxygen oxidation to form a substrate protective layer 102 with a thickness of 5000 Å. The temperature of the dry-oxygen oxidation is 950° C. and the oxygen content is 60%. The substrate 101 adopts conventional materials including silicon.

b. Etching the substrate protective layer 102 selectively, so as to form substrate contacting windows 202 above the substrate 101. The substrate contacting windows 202 run through the substrate protective layer 102;

As shown in FIG. 2: spin-coat a photoresist layer on the surface of substrate protective layer 102, pattern the photoresist layer to form several openings at positions where cold junctions of the thermocouple strips will be produced. The opening width shall be 16 μm, the length of each opening shall be 50 μm and the total length shall be about 700 μm. Subsequently, apply RIE (reactive ion etching) $SiO_2$ technology to transfer the opening patterns on the photoresist layer to substrate protective layer 102 and form substrate contacting windows 202. Finally, using the method of oxygen-plasma-stripping-of-photoresist together with sulfuric acid/hydrogen peroxide wet-cleaning-of-photoresist to remove photoresist on the wafer surface.

c. Depositing a layer of heat conductor 303 over the substrate contacting windows 202, depositing a mask layer for the heat conductor 303. The heat conductor 303 covers the substrate protective layer 102 and fills in the substrate contacting windows 202.

Figure 4:
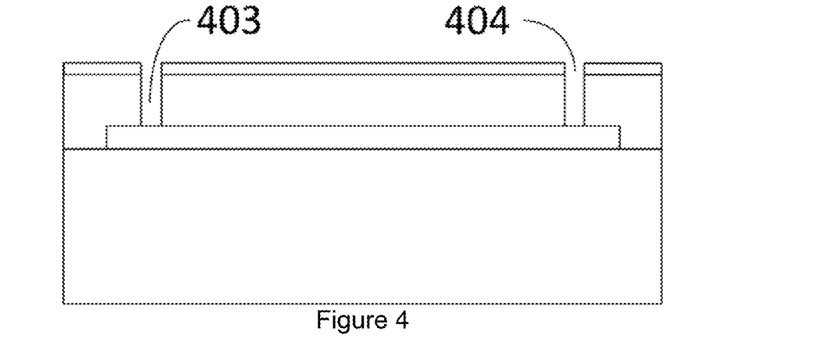
FIG. 4 shows the section view of this invention after the heat-conductor through-holes are formed in the heat conductor.

As shown in FIG. 3, applying an LPCVD process for deposition of a Poly-Si layer thus to form heat conductor 303 on the substrate protective layer 102, on which openings have been produced. Applying another LPCVD process to form a heat-conductor mask layer 304, the material of which is $SiO_2$. Wherein the thickness of the heat conductor 304 is 1 μm, the thickness of the heat-conductor mask layer 304 is 1000 Å. As the thickness of heat conductor 304 is significantly greater than that of the substrate protective layer 102, the heat conductor 303 may completely fill the substrate contacting windows 202 and form Poly-Si heat-conductor fill-in structures 302.

d. Etching the heat-conductor mask layer 304 selectively so as to form heat-conductor etching windows 404. The heat-conductor etching windows 404 run through the heat-conductor mask layer 304 along the inner sides of the substrate contacting windows 202. Using the heat-conductor etching windows 404 to etch the heat conductor 303 till reaching the substrate protective layer 102 thus to form heat-conductor through-holes 403.

Figure 5:
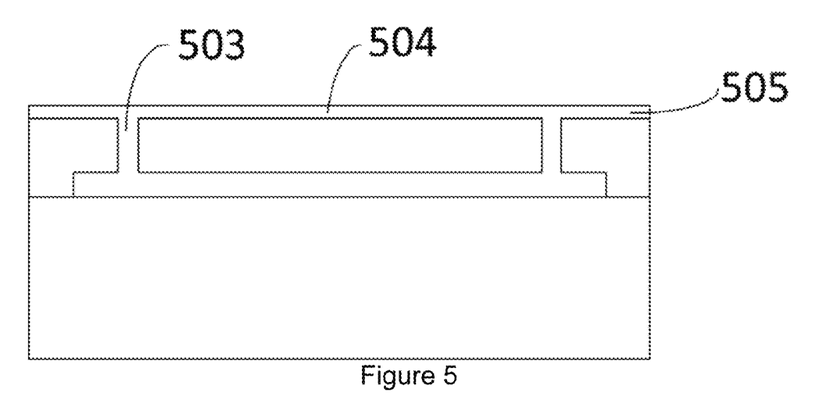
FIG. 5 shows the section view of this invention after releasing barrier band structure is formed.

As shown in FIG. 4, spin-coating a photoresist layer on the surface of heat-conductor mask layer 304, patterning the photoresist layer to form squarely-closed ring-openings. Apply RIE to anisotropically etch the heat-conductor mask layer 304, and transferring the opening patterns on the photoresist to the heat-conductor mask layer 304, thus to form squarely-closed rings on the heat-conductor mask layer 304, namely the heat-conductor etching windows 404. Use the method of oxygen-plasma-stripping-of-photoresist together with sulfuric acid/hydrogen peroxide wet-cleaning-of-photoresist to remove photoresist on the wafer surface. Later on, applying RIE to anisotropically etch the heat conductor 303, transfer the opening patterns on heat-conductor mask layer 304 to the heat conductor 303, thus to form squarely-closed ring-opening patterns on heat conductor 303, namely heat-conductor through-holes 403. The width of the heat-conductor through-holes shall be 8000 Å.

e. Depositing a supporting layer 505 on the heat-conductor mask layer 304, making the supporting layer 505 fill in the heat-conductor through-holes 403 and heat-conductor etching windows 404, and also cover the heat-conductor mask layer 304 so as to form a releasing barrier band structure 503 and the supporting membrane 504 above the substrate 101.

Figure 6:
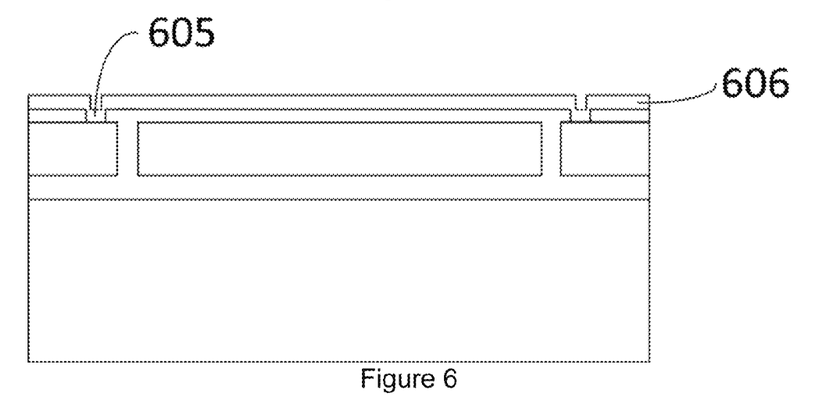
FIG. 6 shows the section view of this invention after thermal-conductive-electrical-isolated layer is formed.

As shown in FIG. 5, deposit a supporting layer 505 on the substrate 101 with produced heat-conductor through-holes 403 and heat-conductor etching windows 404, by using LPCVD technology. The supporting layer 505 is $SiO_2$. The thickness of the supporting layer 505 is 5000 Å. The supporting layer 505 may completely fill the heat-conductor through-holes 403 and heat-conductor etching windows 404, thus to form a $SiO_2$ releasing barrier band structure 503, as well as a supporting membrane 504. Herein, the releasing barrier band structure 503 corresponds to the releasing barrier band 2 in FIG. 17, and is subsequently used to form the releasing barrier band 2.

f. Etching the supporting layer 505 selectively so as to form thermal-conductive-electrical-isolated openings 605 within the supporting layer 505. The thermal-conductive-electrical-isolated openings 605 run through the supporting layer 505 and locate at the lateral sides of the releasing barrier band 503. Depositing a thermal-conductive-electrical-isolated layer 606 over the supporting layer 505. The thermal-conductive-electrical-isolated layer 606 fills in the thermal-conductive-electrical-isolated openings 605, and covers the supporting layer 605.

Figure 7:
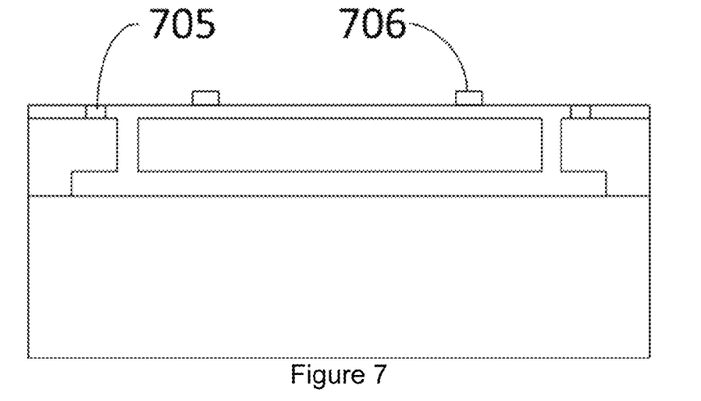
FIG. 7 shows the section view of this invention after the first thermal-conductive-electrical-isolated blocks and the second thermal-conductive-electrical-isolated blocks are formed.

As shown in FIG. 6, spin-coat a photoresist layer on the supporting layer 505, pattern the photoresist layer to form several openings at positions where cold junctions of the thermocouple strips will be produced. The width of the openings shall be 15 μm, and the length of each opening shall be 35 μm. Apply RIE $SiO_2$ to anisotropically transfer the opening patterns on the photoresist layer to the supporting layer 505, thus to form thermal-conductive-electrical-isolated openings 605. Use the method of oxygen-plasma-stripping-of-photoresist together with sulfuric acid/hydrogen peroxide wet-cleaning-of-photoresist to remove photoresist on the wafer surface. Later on, depositing a thermal-conductive-electrical-isolated layer 606 on the supporting layer 505 by using an LPCVD process. Herein, the material of the thermal-conductive-electrical-isolated layer 606 is $Si_3N_4$ and its thickness is 5000 Å.

g. Etching the thermal-conductive-electrical-isolated layer 606 selectively, so as to form the first thermal-conductive-electrical-isolated blocks 705 and the second thermal-conductive-electrical-isolated blocks 706 over the supporting layer 505. The first thermal-conductive-electrical-isolated blocks 705 are within the supporting layer 505 and the second thermal-conductive-electrical-isolated blocks 706 are on the supporting layer 505.

Figure 8:
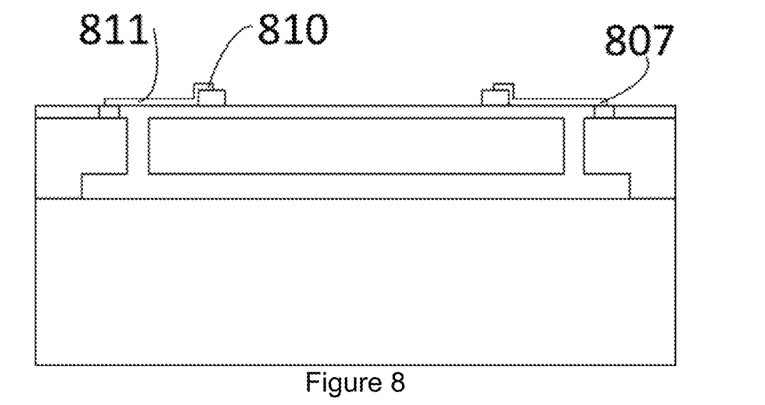
FIG. 8 shows the section view of this invention after the first and second thermocouple strips are formed.

As shown in FIG. 7, spin-coat a photoresist layer on the thermal-conductive-electrical-isolated layer 606, pattern the photoresist layer to form several patterns at positions where cold/hot junctions of the thermocouple strips will be produced. Then, use the RIE $Si_3N_4$ to anisotropically transfer the patterns on the photoresist layer to the thermal-conductive-electrical-isolated layer 606, thus to form the first thermal-conductive-electrical-isolated blocks 705 and the second thermal-conductive-electrical-isolated blocks 706, which correspond to the first thermal-conductive-electrical-isolated structures 4 and the second thermal-conductive-electrical-isolated structures 3 in FIG. 17, respectively. The width for each of the first thermal-conductive-electrical-isolated blocks 705 is 18 μm, the length is 80 μm, while those of the second thermal-conductive-electrical-isolated blocks 706 are 18 μm and 80 μm, respectively. Subsequently, the method of oxygen-plasma-stripping-of-photoresist together with sulfuric acid/hydrogen peroxide wet-cleaning-of-photoresist is used to remove photoresist on the wafer surface.

h. Setting thermocouple strips 811 within the region between the first thermal-conductive-electrical-isolated blocks 705 and the second thermal-conductive-electrical-isolated blocks 706 close to the first ones. The thermocouple strips 811 comprise N-type thermocouple strips 6 and P-type thermocouple strips 5. The cold junctions of thermocouple strips 811 are in contact with the first thermal-conductive-electrical-isolated blocks 705 and the hot junctions are in contact with the second thermal-conductive-electrical-isolated blocks 706.

As shown in FIG. 8, on the substrate 101 produced with the first thermal-conductive-electrical-isolated structures 4 and second thermal-conductive-electrical-isolated structures 3, deposit a Poly-Si layer with a thickness of 2000 Å by using LPCVD technology. Then, the Poly-Si layer is doped with different implantation types in different regions, namely the N-type implantation and P-type implantation. Herein, the doping concentrations for the P-type and N-type Poly-Si are $8e18$ $cm^{-3}$ and $4e19$ $cm^{-3}$, while the implantation energies are 30 KeV and 80 KeV, respectively. In one embodiment, the N-type thermocouple strips 6 and P-type thermocouple strips 5 are doped with a low concentration, thus the Seebeck coefficients of them are high and conducive to improving performance of the device. The doping concentrations for the thermocouple strips of existing thermopile IR detectors are higher than those in one embodiment.

Consequently, the resistance of these IR detectors is smaller and conducive to reducing noise from the device. However, due to higher doping concentrations, the Seebeck coefficients of thermocouple strips are lower. Thus, the detection sensitivity of these devices is affected. In order to improve the detection sensitivity, a mostly used method is to increase the pair number of thermocouples. However, such a method may lead to larger resistance and higher noise of the device. In present invention, lower doping concentrations are adopted, thus may lead to effectively improve detection sensitivity of the device.

In order to reduce noise from the IR detector, in terms of device structures, this invention uses fewer thermocouples. In one embodiment, detection sensitivity of IR detector is improved by using thermocouple strips of lower doping concentrations, and noise is reduced by reducing the pair number of thermocouples. Experiments show that the detection rate in this invention is improved by adopting the thermocouple strips with a doping concentration as described due to less pairs of thermocouples, namely, in one embodiment, detection rate of IR detectors can be effectively improved.

Spin-coat a photoresist layer on the Poly-Si layer after N-type and P-type implantation, photo-pattern the photoresist layer to form photoresist patterns at positions corresponding to thermocouple strips; apply RIE Poly-Si technology to transfer the photoresist patterns to the Poly-Si layer and form thermocouple strips 811. The thermocouple strips 811 comprise N-type thermocouple strips 6 and P-type thermocouple strips 5; a thermocouple is formed between one N-type thermocouple strip 6 and one corresponding P-type thermocouple strip 5, which are distributed in parallel. The cold junctions 807 of thermocouple strips 811 are connected with the first thermal-conductive-electrical-isolated blocks 705, the hot junctions 810 bridge half-patterns of the second thermal-conductive-electrical-isolated blocks 706. Finally, use the method of oxygen-plasma-stripping-of-photoresist together with sulfuric acid/hydrogen peroxide wet-cleaning-of-photoresist to remove photoresist on the wafer surface. Herein, the width for each of the thermocouple strips is 3 μm, length is 125 μm and number of pairs is 20. The thermocouple strips are symmetrically arranged around the lateral-sides of the IR absorber in square-shape.

Figure 9:
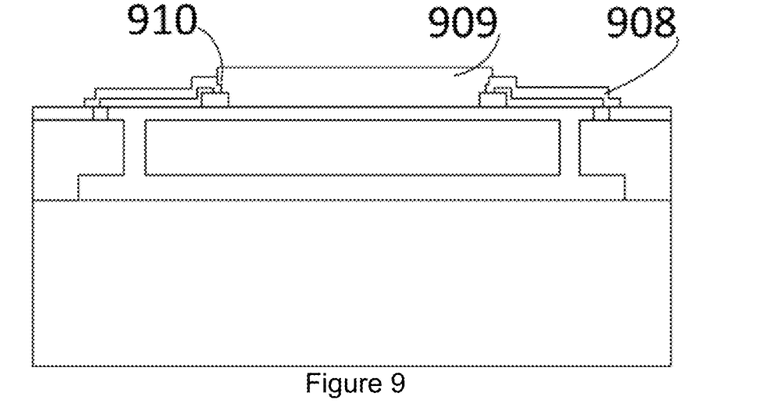
FIG. 9 shows the section view of this invention after black silicon material is deposited.

In one embodiment, the P-type thermocouple strips 5 and N-type thermocouple strips 6 are located on the releasing barrier band structure 503. At the cold junctions, both P-type thermocouple strips 5 and N-type thermocouple strips 6 are in contact with the first thermal-conductive-electrical-isolated blocks 705, while at the hot junctions, both the P-type thermocouple strips 5 and N-type thermocouple strips 6 are in contact with the second thermal-conductive-electrical-isolated structures 3.

i. A thermocouple protective layer 908 is set over the thermocouple strips 811, the region covered by the thermocouple protective layer 908 comprises of the thermocouple strips 811 and the first thermal-conductive-electrical-isolated blocks 705; the black silicon material 909 is formed within the region constructed by the second thermal-conductive-electrical-isolated blocks 706 and the black silicon material 909 is in contact with the second thermal-conductive-electrical-isolated blocks 706.

As shown in FIG. 9, deposit a thermocouple protective layer 908 with a thickness of 2000 Å above the substrate 101, which has the produced thermocouple strips 811, by using LPCVD technology as well. Subsequently, spin-coat a photoresist layer on the thermocouple protective layer 908, and pattern the photoresist layer to form patterns with large areas at positions where thermocouple strips are located. Apply RIE $SiO_2$ to anisotropically transfer the photoresist patterns to the thermocouple protective layer 908. Herein, the thermocouple protective layer 908 completely covers the first thermal-conductive-electrical-isolated structures 4 while the second thermal-conductive-electrical-isolated structures 3 are not completely covered by the thermocouple protective layer 908, with an exposed width of 9 μm.

In one embodiment, the thermocouple protective layer 908 covers halves of the second thermal-conductive-electrical-isolated blocks 706, the second thermal-conductive-electrical-isolated blocks 706 are not completely covered by the thermocouple protective layer 908, mainly for assuring that the black silicon material 909 and the second thermal-conductive-electrical-isolated blocks 706 are in contact with each other and thus ensuring that the heat absorbed by the subsequently formed black silicon-based IR absorber 1 may be transferred to thermopile through the second thermal-conductive-electrical-isolated blocks 706. The area on the second thermal-conductive-electrical-isolated blocks 706 to be covered by the thermocouple protective layer 908 can be set based on specific needs, on condition that the heat absorbed by the black silicon-based IR absorber 1 may be transferred to thermocouples through the second thermal-conductive-electrical-isolated blocks 706.

Figure 10:
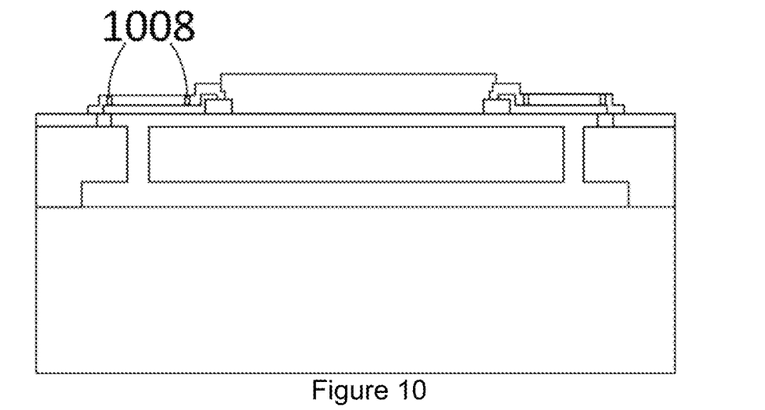
FIG. 10 shows the section view of this invention after electrical-connection through-holes are formed.

Then, use the method of oxygen-plasma-stripping-of-photoresist together with sulfuric acid/hydrogen peroxide wet-cleaning-of-photoresist to remove photoresist on the wafer surface. Subsequently, deposit a 1 μm-thick black silicon material 909 with Poly-Si as its material, by using PECVD technology. Further, pattern the black silicon material 909 at a position where IR absorber will be generated. The black silicon material 909 patterns also bridge the second thermal-conductive-electrical-isolated structures 3 at the hot junctions of thermocouple strips, as shown in the bridging region 910 of the figure. Subsequently, use the method of oxygen-plasma-stripping-of-photoresist together with sulfuric acid/hydrogen peroxide wet-cleaning-of-photoresist to remove photoresist on the wafer surface. Herein, the furnace temperature for PECVD of the black silicon material 909 is 270° C., the pressure is 400 mTorr, the RF power is 170 W and the flowing rate of $SiH_4$ is 300 sccm.

j. Etching the above-mentioned thermocouple protective layer 908 selectively, so as to form electrical-connection through-holes 1008 above the substrate 101 for purpose of connecting thermocouple strips 811.

Figure 11:
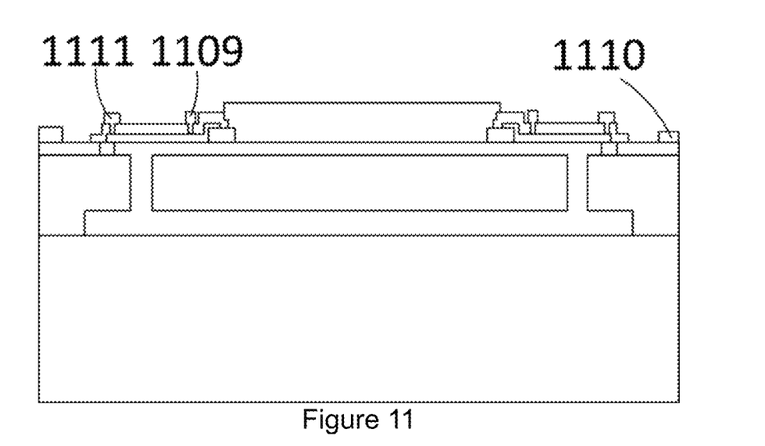
FIG. 11 shows the section view of this invention after the first connecting lines, the second connecting lines as well as the first electrical connectors are formed.

As shown in FIG. 10, spin-coating a photoresist layer on the surface of substrate 101, patterning the photoresist layer to form several openings at positions where electrical-connection through-holes 1008 will be formed. Applying RIE $SiO_2$ to transfer the opening patterns on the photoresist layer to thermocouple protective layer 908 and form opening patterns in the thermocouple protective layer 908, namely, electrical-connection through-holes 1008; and finally, using the method of oxygen-plasma-stripping-of-photoresist together with sulfuric acid/hydrogen peroxide wet-cleaning-of-photoresist to remove photoresist on the wafer surface.

k. Sputtering a metal layer on the substrate 101 with produced electrical-connection through-holes 1008. The metal layer shall be filled in the above-mentioned electrical-connection through-holes 1008. Masking and etching the above-mentioned metal layer selectively and at the cold junctions formed, making N-type thermocouple strips 6 and P-type thermocouple strips 5 in thermocouple strips 811 be electrically connected through the first connecting lines 1109; while at the hot junctions formed, making P-type thermocouple strips 5 and N-type thermocouple strips 6 in adjacent thermocouple strips 811 be electrically connected through the second connecting lines 1111, and making the first electrical connectors 1110 at the lateral sides of the first thermal-conductive-electrical-isolated structures 705.

Figure 12:
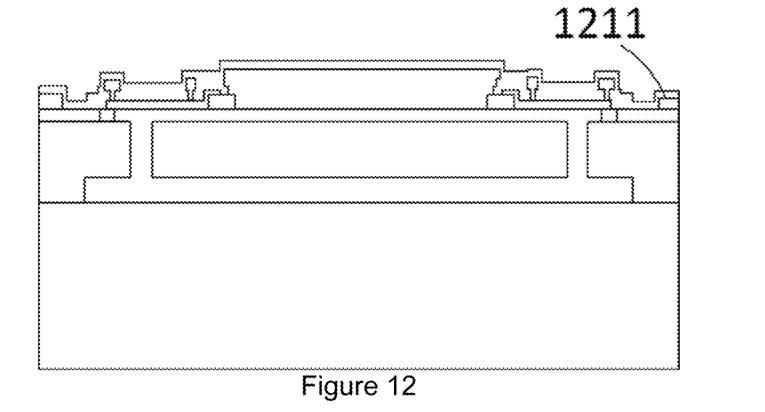
FIG. 12 shows the section view of this invention after the passivation layer is deposited.
Figure 13:
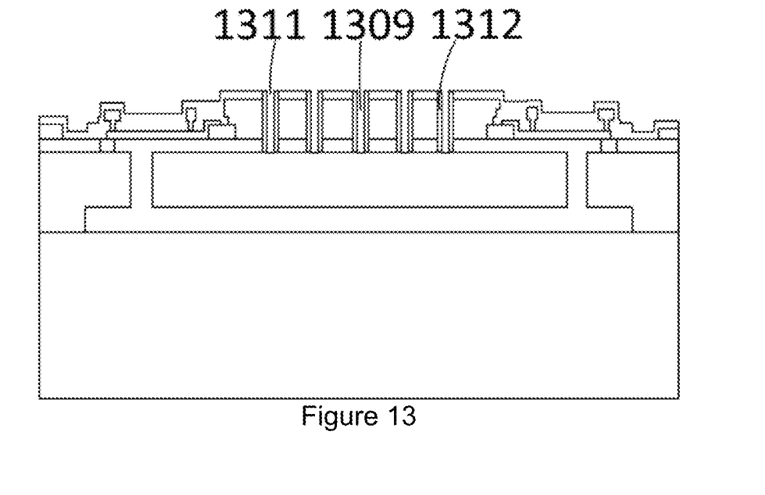
FIG. 13 shows the section view of this invention after releasing openings are formed and the inner walls are coated with a releasing barrier layer.

As shown in FIG. 11, sputtering an Al metal layer on the substrate 101 with produced electrical-connection through-holes 1008 and form patterns at required positions for electrical-connection and metallic electrodes in the Al metal layer by photolithography, so as to form the first connecting lines 1109, the second connecting lines 1111 and the first electrical connectors 1110. Then, removing photoresist on the wafer surface by means of organic cleaning. The outermost second connecting lines 1111 are used for electrically connecting the metal connecting lines 7 and metal electrodes 8. The first electrical connectors 1110 are in corresponding to metal electrodes 8 and are used for forming metal electrodes 8. While serial connection is adopted in this case, a P-type thermocouple strip 5 in a thermocouple is electrically connected with an N-type thermocouple strip 6 in the adjacent thermocouple through a first connecting line 1109, similarly, the other thermocouple strips are connected thus to form a thermopile. In one embodiment, the hot junctions refer to the hot junctions of the IR detector, and the cold junctions refer to the cold junctions of the IR device.

l. Depositing to form a passivation layer 1211 on the surface of the substrate 101. The passivation layer 1211 covers the black silicon material 909, the first connecting lines 1109, the second connecting lines 1111 and the first electrical connectors 1110;

As shown in FIG. 12, depositing to form a 1000 Å-thick $SiO_2$ layer on the substrate 101 with produced metallic patterns, by applying PECVD process to form a passivation layer 1211.

m. Etching the passivation layer 1211 selectively, so as to form black silicon etching windows 1311 on the passivation layer 1211 over the black silicon material 909; etch black silicon material 909 with help of the black silicon etching windows 1311, till reaching heat conductors 303 right under the black silicon etching windows 1311 to form releasing openings 1309.

As shown in FIG. 13, spin-coating a photoresist layer on the passivation layer 1211, patterning the photoresist layer to form photoresist openings in the regions inside the absorber, the areas between every two thermocouple strips and the areas surrounded by the squarely-closed ring-openings (other than thermocouple-strip regions and absorber) by means of photolithography. Then, applying RIE $SiO_2$/Poly-Si/$SiO_2$ to transfer the photoresist opening patterns to different material layers, namely, to form releasing openings 1309 and black silicon etching windows 1311.

Figure 14:
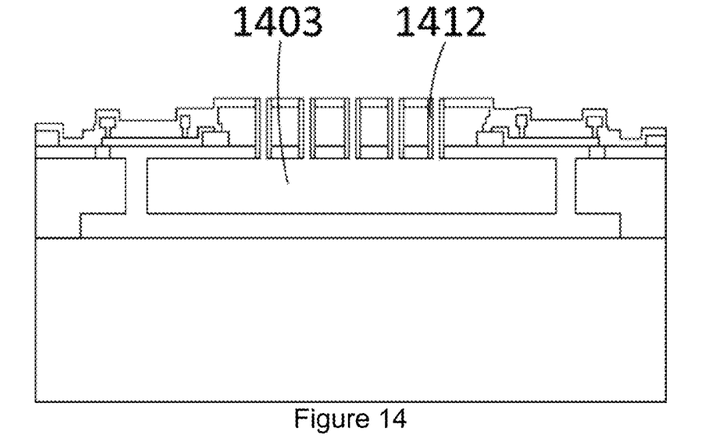
FIG. 14 shows the section view after heat isolation cavity is formed by releasing the heat conductor.

In order to protect the Poly-Si within the region of the IR absorber against damage caused by the releasing gas, a releasing barrier layer 1312 is coated around the inner sidewalls of the etching windows, by means of PECVD and photolithography. Herein, the material for the releasing barrier layer 1312 is photoresist, and the thickness of the releasing barrier layer 1312 is 2 μm. After the releasing barrier layer 1312 is coated, the releasing openings 1309 become smaller. In one embodiment, the black silicon etching windows 1311 and the releasing openings 1309 form releasing channels 9 together.

n. Releasing the heat conductor 303 right under the black silicon material 909 using the releasing barrier band structure 503 as an etching stop, thus to obtain a thermal isolation cavity 1403.

As shown in FIG. 14, as the material of heat conductors 303 is Poly-Si, thus $XeF_2$ dry etching method is adopted to isotropically etch the heat conductor 303 in the device structure, etch Poly-Si material of heat conductor 303 with help of the releasing channels 9 and thereby form a thermal isolation cavity 1403. The black silicon barrier layer 1412 in FIG. 14 is in corresponding to the releasing barrier layer 1312 in FIG. 13.

o. Using the passivation layer 1211 as the sidewall material for the black silicon material 909; applying RIE on the black silicon material 909 so as to form black silicon-based IR absorber 1 based on black silicon structures 1509, and at the same time to form the second electrical connectors 1510.

As shown in FIG. 15, making use of the features that the passivation layer 1211 which covers the rough black silicon material 909 can be adopted as sidewall material for the rough structures, by applying RIE Poly-Si technology only once, the black silicon structures 1509 can be produced. Herein, the black silicon structures 1509 are in morphologies of nanoneedles or nanopillars. During the anisotropic etching, the passivation layer 1211 above the first electrical connectors 1110 are completely etched, thus the second electrical connectors 1510 are revealed. Finally, the novel MEMS thermopile IR detector with black silicon-based absorber is obtained and its overall structure diagram is as shown in FIG. 17. In this invention, to prepare the black silicon-based IR absorber 1, the feature that the rough Poly-Si surfaces can be used as sidewall supporting structures in anisotropic etching with a high selectivity, is utilized. In this invention, black silicon material 909 layer (its material is Poly-Si) used for preparation of the black silicon-based IR absorber 1 can be obtained by means of PECVD or LPCVD.

Figure 16:
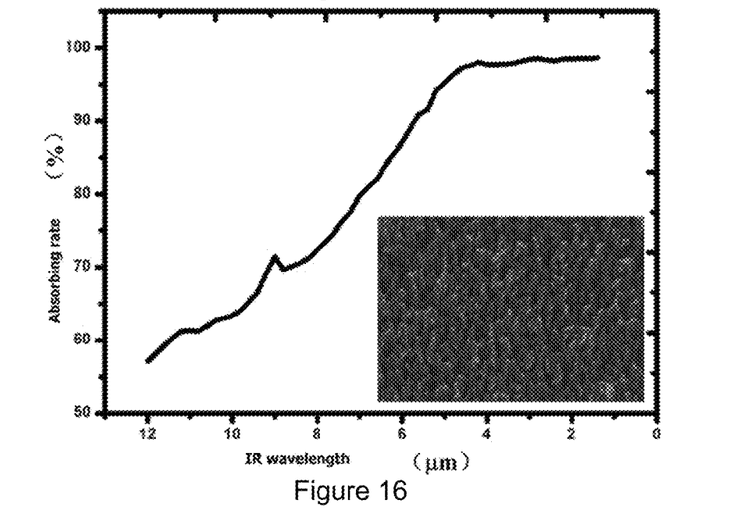
FIG. 16 shows scanning electron microscope image and IR absorption spectroscopy of the black silicon.

The scanning electron microscope images of the black silicon structures 1509 and their IR absorption spectroscopy are as shown in FIG. 16. In one embodiment, the second electrical connectors 1510 are in corresponding to the first electrical connectors 1110, as well as the electrodes 8 in FIG. 17. Herein, the second electrical connectors 1510 are used to output the detection results of the entire thermopile IR detector.

For the thermopile IR detector obtained by the described method presented in one embodiment, the theoretical responsivity shall reach 577V/W; detection rate shall reach 3.48E8 $cmHz^{1/2}W^{-1}$, thermal response time shall reach 82.9 ms and noise density shall be 91 $nV/Hz^{1/2}$.

As shown in FIGS. 1 to 17: to operate, the black silicon-based IR absorber 1 absorbs the heat from IR incident light, and the absorbed heat is transferred to thermocouples on lateral sides of black silicon-based IR absorber 1 through the second thermal-conductive-electrical-isolated structures 3. The cold junctions of thermopile are connected with the substrate 101 through the first thermal-conductive-electrical-isolated structures 4 as well as heat conductors 303, so as to keep the temperature of cold junctions and that of the substrate 101 be consistent and achieve the effect of electrical isolation. A thermocouple is constructed by an N-type thermocouple strip 6 and a P-type thermocouple strip 5.

After heat is absorbed by the hot junctions of the thermopile, temperature difference between the hot junctions and cold junctions will generate certain potential difference at the cold junctions. A number of thermocouples in the thermopile are connected in series and output voltage through the electrodes 8. Detection process can then be determined based on the output voltage.

Black silicon-based IR absorber is applied in this invention. Due to the high absorption efficiency of the black silicon, high responsivity, high detection rate and other outstanding features of the device can be achieved, black silicon may overcome the poor responsivity and detection rate of detectors using $Si_3N_4$ as the material of the IR absorber. There are no stringent requirements on the process parameters (such as thickness of $SiO_2$ and Poly-Si, etching time and etching thickness etc.) for preparing the black silicon. Therefore, the black silicon-based IR detector is easy to realize, and thus can overcome the defects of the detectors using ¼-wavelength resonant structures as absorbers, including the stringent requirements on process parameters and poor controllability of performance. As black silicon may achieve very high IR absorption efficiency within large wavelength range, such devices have a large applicable wavelength range and may overcome the defects of the detectors using ¼-wavelength resonant structures as absorbers as being only applicable to certain central wavelengths. The technical idea of "release first, followed by black silicon preparation" is adopted in the preparation process of the present invention, effectively overcoming the problem of easily damaged black silicon structure in the technical method of "black silicon first, followed by structure release".

Design and fabrication of thermal-conductive-electrical-isolated structures are respectively carried out at the thermopile hot/cold junctions of the invented detector, which may further improve the performance of the device. Fabrication process of the detector is fully compatible with CMOS process, which is conducive to monolithic integration of the detector structure with circuit. The novel MEMS thermopile IR detector with high performance presented in this invention has features of excellent processing compatibility with CMOS fabrication, easy realization of device structure, easy monolithic integration with circuit, high responsivity and detection rate, and also can be widely and practically used in temperature sensors, gas sensors, thermal flow meters and other sensing devices and systems.

What is claimed is:

1. A black silicon-based high-performance MEMS thermopile infrared (IR) detector, comprising:
   a substrate, wherein:
   a releasing barrier band formed on the substrate;
   a thermal isolation cavity formed in the releasing barrier band;
   a black silicon-based IR absorber disposed above the thermal isolation cavity;
   the black silicon-based IR absorber set on the releasing barrier band;
   a number of thermocouples set around lateral sides of the black silicon-based IR absorber;
   the thermocouples around the black silicon-based IR absorber are electrically connected in series to form a thermopile;
   metallic electrodes are set beside the thermopile to output electrical signals;
   one-side terminals of the thermopile adjacent to the IR absorber form the hot junctions and the other-side terminals far away from the IR absorber form the cold junctions;
   the cold junctions of the thermopile are connected to the substrate through the first thermal-conductive-electrical-isolated structures as well as the heat conductor under the first thermal-conductive-electrical-isolated structures;
   the heat conductor is located outside the thermal isolation cavity but between the releasing barrier band and the substrate;
   the first thermal-conductive-electrical-isolated structures are embedded in the releasing barrier band;
   the hot junctions of the thermopile are in contact with the IR absorber through the second thermal-conductive-electrical-isolated structures; and
   the second thermal-conductive-electrical-isolated structures are located above the releasing barrier band,
   wherein the black silicon-based IR absorber is in square-morphology, and four groups of thermopiles are uniformly distributed around the lateral sides of the black silicon-based IR absorber.

2. A black silicon-based high-performance MEMS thermopile infrared (IR) detector, comprising:
   a substrate, wherein:
   a releasing barrier band formed on the substrate;
   a thermal isolation cavity formed in the releasing barrier band;
   a black silicon-based IR absorber disposed above the thermal isolation cavity;
   the black silicon-based IR absorber set on the releasing barrier band;
   a number of thermocouples set around lateral sides of the black silicon-based IR absorber;
   the thermocouples around the black silicon-based IR absorber are electrically connected in series to form a thermopile;
   metallic electrodes are set beside the thermopile to output electrical signals;
   one-side terminals of the thermopile adjacent to the IR absorber form the hot junctions and the other-side terminals far away from the IR absorber form the cold junctions;
   the cold junctions of the thermopile are connected to the substrate through the first thermal-conductive-electrical-isolated structures as well as the heat conductor under the first thermal-conductive-electrical-isolated structures;
   the heat conductor is located outside the thermal isolation cavity but between the releasing barrier band and the substrate;
   the first thermal-conductive-electrical-isolated structures are embedded in the releasing barrier band;
   the hot junctions of the thermopile are in contact with the IR absorber through the second thermal-conductive-electrical-isolated structures; and
   the second thermal-conductive-electrical-isolated structures are located above the releasing barrier band,
   wherein:
   the thermopile includes P-type thermocouple strips and N-type thermocouple strips that correspond to the P-type thermocouple strips;
   the P-type thermocouple strips and N-type thermocouple strips are located on the releasing barrier band;

at the cold junctions, both P-type thermocouple strips and N-type thermocouple strips are in contact with the first thermal-conductive-electrical-isolated structures, and P-type thermocouple strips are electrically connected with N-type thermocouple strips in adjacent thermocouples through the second connecting lines;

at the hot junctions, both the P-type thermocouple strips and N-type thermocouple strips are in contact with the second thermal-conductive-electrical-isolated structures and are electrically connected with the first connecting lines.

3. A fabrication method for a black silicon-based high-performance MEMS thermopile infrared (IR) detector, comprising:
(a) providing a substrate and setting a substrate protective layer on the surface of the substrate;
(b) etching the substrate protective layer selectively, so as to form substrate contacting windows above the substrate, wherein the substrate contacting windows run through the substrate protective layer;
(c) depositing a layer of heat conductor over the substrate contacting windows, and depositing a mask layer for the heat conductor, wherein the heat-conductor mask layer covers the substrate protective layer and fills in the substrate contacting windows;
(d) etching the heat-conductor mask layer selectively so as to form heat-conductor etching windows, wherein the heat-conductor etching windows run through the heat-conductor mask layer along the inner sides of the substrate contacting windows, and using the heat-conductor etching windows to etch the heat conductor till reaching the substrate protective layer to form heat-conductor through-holes;
(e) depositing a supporting layer on the heat-conductor mask layer, making the supporting layer fill in the heat-conductor through-holes and heat-conductor etching windows and also cover the heat-conductor mask layer so as to form a releasing barrier band structure and the supporting membrane over the substrate;
(f) etching the supporting layer selectively so as to form thermal-conductive-electrical-isolated openings within the supporting layer, wherein the thermal-conductive-electrical-isolated openings run through the supporting layer and locate at the lateral sides of the releasing barrier band structure, and depositing a thermal-conductive-electrical-isolated layer over the supporting layer, wherein the thermal-conductive-electrical-isolated layer fills in the thermal-conductive-electrical-isolated openings and covers the supporting layer;
(g) etching the thermal-conductive-electrical-isolated layer selectively so as to form the first thermal-conductive-electrical-isolated blocks and the second thermal-conductive-electrical-isolated blocks over the supporting layer, wherein the first thermal-conductive-electrical-isolated blocks are within the supporting layer and the second thermal-conductive-electrical-isolated blocks are over the supporting layer;
(h) setting thermocouple strips within the region between the first thermal-conductive-electrical-isolated blocks and the second thermal-conductive-electrical-isolated blocks close to the first ones, wherein the thermocouple strips include N-type thermocouple strips and P-type thermocouple strips, the cold junctions of thermocouple strips are in contact with the first thermal-conductive-electrical-isolated blocks, and the hot junctions are in contact with the second thermal-conductive-electrical-isolated blocks;
(i) setting a thermocouple protective layer over the thermocouple strips, wherein the region covered by the thermocouple protective layer comprises the thermocouple strips and the first thermal-conductive-electrical-isolated blocks, the black silicon material is formed within the region constructed by the second thermal-conductive-electrical-isolated blocks, and the black silicon material is in contact with the second thermal-conductive-electrical-isolated blocks;
(j) etching the thermocouple protective layer selectively, so as to form electrical-connection through-holes above the substrate for purpose of connecting thermocouple strips;
(k) sputtering a metal layer on the substrate with produced electrical-connection through-holes, wherein the metal layer is filled in the electrical-connection through-holes, masking and etching the metal layer selectively and making the N-type thermocouple strips and P-type thermocouple strips be electrically connected at the hot junctions through the first connecting lines, wherein, at the hot junctions, electrically connect the P-type thermocouple strips to the N-type thermocouple strips in adjacent thermocouples through the second connecting lines, and forming the first electrical connectors at the lateral sides of the first thermal-conductive-electrical-isolated structures;
(l) depositing a passivation layer on the substrate, wherein the passivation layer covers the black silicon material, the first connecting lines, the second connecting lines, and the first electrical connectors;
(m) etching the passivation layer selectively, so as to form black silicon etching windows on the passivation layer over the black silicon material; etching the black silicon material with the black silicon etching windows until reaching the heat conductors right under the black silicon etching windows to form releasing openings;
(n) releasing the heat conductors right under the black silicon material using the releasing barrier band structure as an etching stop to obtain a thermal isolation cavity;
(o) using the passivation layer as the sidewall material for the black silicon material with rough surface; and applying RIE on the black silicon material so as to form the black silicon-based IR absorber and, at the same time, to form the second electrical connectors.

4. The fabrication method according to claim 3, wherein:
in the steps (m) and (n), coating the inner walls of the releasing openings with a releasing barrier layer for protecting the black silicon material.

5. The fabrication method according to claim 3, wherein:
in the step (h), the P-type thermocouple strips and N-type thermocouple strips are located on the releasing barrier band structure;
at the cold junctions, both P-type thermocouple strips and N-type thermocouple strips are in contact with the first thermal-conductive-electrical-isolated blocks; and
at the hot junctions, both P-type thermocouple strips and N-type thermocouple strips are in contact with the second thermal-conductive-electrical-isolated structures.

6. The fabrication method according to claim 3, wherein:
in the step (k), the material of the metal layer includes Al.

* * * * *